United States Patent
Kim et al.

(10) Patent No.: US 11,846,984 B2
(45) Date of Patent: Dec. 19, 2023

(54) HYBRID COVERLAY/WINDOW STRUCTURE FOR FLEXIBLE DISPLAY APPLICATIONS

(71) Applicant: Apple Inc., Cupertino, CA (US)

(72) Inventors: Hoon Sik Kim, Los Gatos, CA (US); Chang-Chia Huang, San Jose, CA (US); Christopher D. Jones, Los Gatos, CA (US); Masato Kuwabara, Tsukuba (JP); Nikhil D. Kalyankar, Fremont, CA (US); Terry C. Shyu, San Jose, CA (US); Yasmin F. Afsar, San Jose, CA (US); Paul S. Drzaic, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/809,740

(22) Filed: Jun. 29, 2022

(65) Prior Publication Data
US 2023/0011092 A1    Jan. 12, 2023

Related U.S. Application Data

(63) Continuation of application No. 17/078,578, filed on Oct. 23, 2020, now Pat. No. 11,402,868, which is a continuation of application No. 16/528,271, filed on Jul. 31, 2019, now Pat. No. 10,817,016.

(60) Provisional application No. 62/735,569, filed on Sep. 24, 2018.

(51) Int. Cl.
*G06F 1/16* (2006.01)
*H04M 1/02* (2006.01)
*H05K 5/03* (2006.01)
*B32B 17/06* (2006.01)
*B32B 7/12* (2006.01)

(52) U.S. Cl.
CPC .............. *G06F 1/1607* (2013.01); *B32B 7/12* (2013.01); *B32B 17/067* (2013.01); *G06F 1/1643* (2013.01); *G06F 1/1652* (2013.01); *H04M 1/0268* (2013.01); *H05K 5/03* (2013.01); *B32B 2457/208* (2013.01)

(58) Field of Classification Search
CPC .... G06F 1/1607; G06F 1/1643; G06F 1/1652; G06F 2200/1634; B32B 7/12; B32B 17/067; B32B 2457/208; B32B 2255/28; B32B 2307/538; B32B 3/02; B32B 9/047; B32B 2262/101; B32B 2307/584; B32B 2571/00; B32B 5/028; B32B 9/002; B32B 2255/26; B32B 2307/412; H04M 1/0268; H04M 1/185; H05K 5/03
See application file for complete search history.

(56) References Cited

U.S. PATENT DOCUMENTS

| | | | |
|---|---|---|---|
| 9,572,268 B2 * | 2/2017 | Yamazaki | ................ G09G 3/32 |
| 9,710,095 B2 | 7/2017 | Hotelling et al. | |
| 9,864,411 B2 * | 1/2018 | Yamazaki | ............ G09G 3/3225 |

(Continued)

*Primary Examiner* — Lisa Lea-Edmonds
(74) *Attorney, Agent, or Firm* — Aikin & Gallant, LLP

(57) ABSTRACT

Protective cover layers for electronic devices are described. In an embodiment, an electronic device includes a display panel and a protective cover layer over the display panel. The protective cover layer includes a transparent support substrate and a hardcoat layer covering an exterior facing surface of the transparent support substrate. The display panel may be a flexible display panel and the protective cover layer may flex with the flexible display panel.

20 Claims, 11 Drawing Sheets

(56) References Cited

U.S. PATENT DOCUMENTS

| | | | |
|---|---|---|---|
| 10,031,554 B2 | 7/2018 | Yanagisawa | |
| 10,288,788 B2 | 5/2019 | Chen et al. | |
| 10,521,065 B2 | 12/2019 | Hotelling et al. | |
| 10,534,401 B2 | 1/2020 | Yanagisawa | |
| 10,540,045 B2 | 1/2020 | Shingai et al. | |
| 10,551,880 B1 | 2/2020 | Ai et al. | |
| 10,817,016 B2 * | 10/2020 | Kim | H04M 1/0268 |
| 10,834,814 B2 | 11/2020 | Cho et al. | |
| 10,877,302 B2 * | 12/2020 | Shin | G02F 1/133308 |
| 10,928,566 B2 | 2/2021 | Wilson | |
| 10,974,487 B2 | 4/2021 | Chu et al. | |
| 10,990,131 B2 * | 4/2021 | Lin | G06F 1/1643 |
| 11,059,266 B2 * | 7/2021 | Wilson | G06F 3/041 |
| 11,402,868 B2 * | 8/2022 | Kim | B32B 9/047 |
| 2008/0106200 A1 | 5/2008 | Hori et al. | |
| 2008/0165158 A1 | 7/2008 | Hotelling et al. | |
| 2009/0160819 A1 | 6/2009 | Sasaki et al. | |
| 2010/0103126 A1 | 4/2010 | Nakamura et al. | |
| 2010/0219750 A1 | 9/2010 | Hori et al. | |
| 2011/0151937 A1 | 6/2011 | Kusuda et al. | |
| 2014/0162043 A1 * | 6/2014 | Schmid | B32B 17/06 428/432 |
| 2015/0261259 A1 * | 9/2015 | Endo | G06F 1/1641 361/679.06 |
| 2017/0010750 A1 | 1/2017 | Hotelling et al. | |
| 2017/0092884 A1 * | 3/2017 | Zhang | G06F 1/1652 |
| 2017/0139516 A1 | 5/2017 | Koike et al. | |
| 2018/0113529 A1 | 4/2018 | Shingai et al. | |
| 2018/0150109 A1 | 5/2018 | Qian et al. | |
| 2018/0264790 A1 * | 9/2018 | Leatherdale | B32B 7/12 |
| 2018/0348567 A1 * | 12/2018 | Shin | H01L 27/1262 |
| 2019/0364683 A1 * | 11/2019 | Matsubara | B32B 27/08 |
| 2019/0391614 A1 | 12/2019 | Mathew et al. | |
| 2020/0097044 A1 * | 3/2020 | Kim | B32B 17/067 |
| 2020/0125216 A1 | 4/2020 | Hotelling et al. | |
| 2020/0201482 A1 | 6/2020 | Weisse et al. | |
| 2020/0264713 A1 | 8/2020 | Virgili et al. | |
| 2021/0096595 A1 * | 4/2021 | Kim | H04M 1/0268 |
| 2021/0206145 A1 * | 7/2021 | Chu | B32B 17/06 |
| 2023/0011092 A1 * | 1/2023 | Kim | G06F 1/1652 |

* cited by examiner

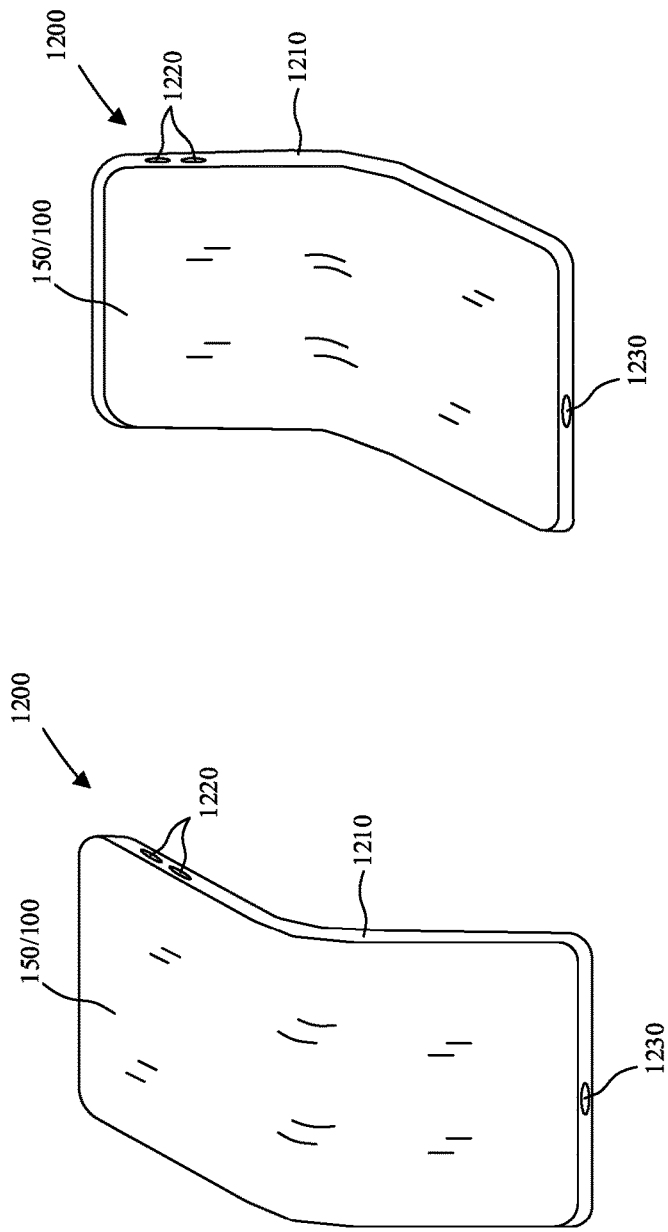
FIG. 12B
FIG. 12A
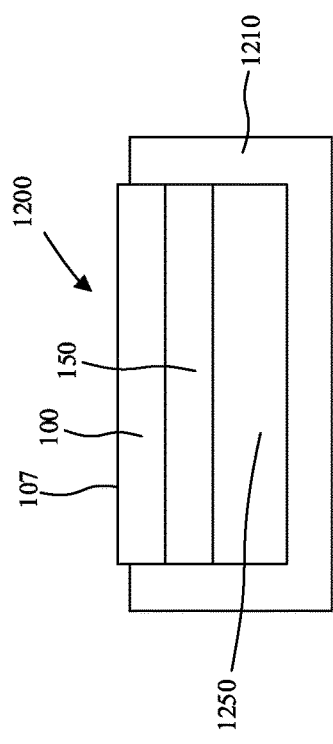
FIG. 13

HYBRID COVERLAY/WINDOW STRUCTURE FOR FLEXIBLE DISPLAY APPLICATIONS

RELATED APPLICATIONS

This application is a continuation of co-pending U.S. application Ser. No. 17/078,578 filed Oct. 23, 2020, which is a continuation of U.S. application Ser. No. 16/528,271 filed Jul. 31, 2019, now U.S. Pat. No. 10,817,016, which claims the benefit of priority from U.S. Provisional Patent Application Ser. No. 62/735,569 filed on Sep. 24, 2018. Both U.S. application Ser. No. 16/528,271 and U.S. Provisional Patent Application Ser. No. 62/735,569 are incorporated herein by reference.

BACKGROUND

Field

Embodiments described herein relate to protective cover layer structures for portable electronic devices, and more particularly for flexible displays.

Background Information

Portable and wearable electronic devices commonly include a housing module that encases various components of the electronic device such as a display screen, touch screen, and protective cover layer. The protective cover layer may be a transparent plastic or glass material that provides a protective outer surface of the electronic device, and also functions as a transparent window for the display screen. Common requirements of the protective cover layer include transparency, rigidity, and scratch resistance.

SUMMARY

Electronic devices with display panels and protective cover layer structures are described. In accordance with some embodiments, the display panels and protective cover layer structures can be curved, flexible, and/or conformable. In an embodiment, an electronic device includes a display panel and a protective cover layer over the display panel. The protective cover layer may include a transparent support substrate and a hardcoat layer covering an exterior facing surface of the transparent support substrate. The hardcoat layer may optionally define an exterior surface of the electronic device.

In some embodiments, the hardcoat layer is characterized by a lower elastic modulus and lower hardness than the transparent support substrate. It is not a requirement that the hardcoat layer have a lower hardness. In some embodiments, the hardcoat layer is characterized by a lower elastic modulus and higher elongation-to-break. The hardcoat layer may be formed on a single surface or multiple surfaces of the transparent support substrate. In accordance with embodiments, the transparent support substrate may be a brittle substrate such as glass or sapphire rather than polymeric substrate. Nevertheless, the brittle substrate may be curved, flexible, and/or conformable.

BRIEF DESCRIPTION OF THE DRAWINGS

FIGS. 12A-12B are schematic isometric view illustrations of an electronic device in accordance with embodiments.

FIG. 13 is a schematic cross-sectional side view illustration of an electronic device in accordance with an embodiment.

DETAILED DESCRIPTION

Figure 1:
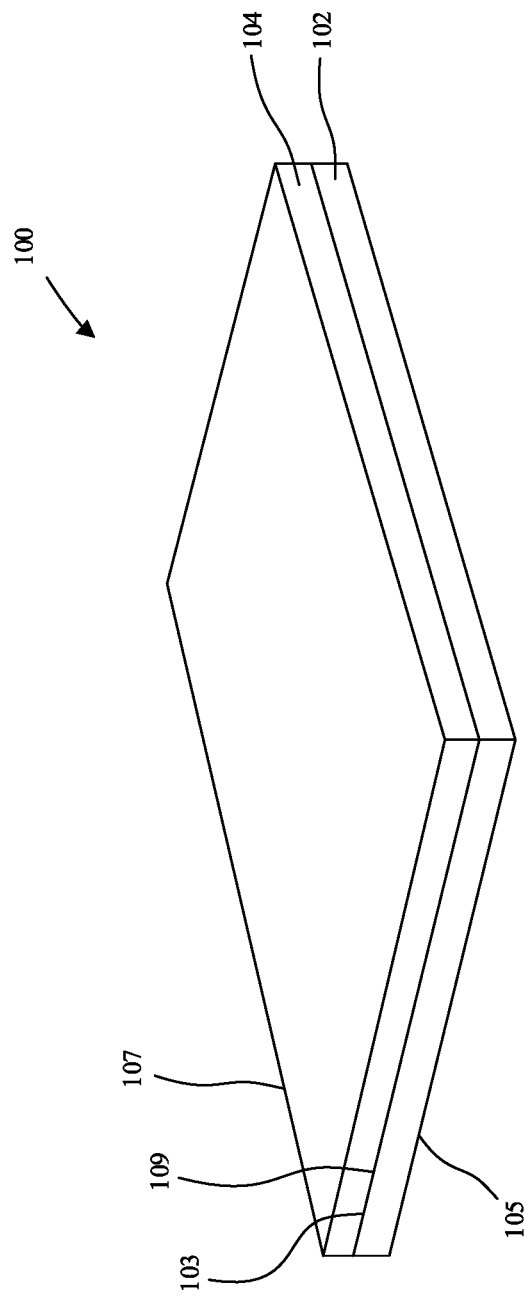
FIG. 1 is a schematic isometric view illustration of a protective cover layer in accordance with an embodiment.

Embodiments describe display modules and protective cover layer structures. In particular, embodiments describe protective cover layer structures that may be implemented in curved, flexible, conformable and foldable display modules, and in particular with curved, flexible, conformable and foldable display panels. Various embodiments are described in which a hardcoat layer is applied to a transparent support substrate to form a protective cover layer structure. The hardcoat layer may be characterized as possessing a lower elastic modulus, higher elongation-to-break and optionally a lower hardness than the transparent support substrate. In one aspect, such a hybrid structure may prevent cracks from forming in the transparent support substrate. In another aspect, such a hybrid structure may move the neutral plane of protective cover layer so that the surfaces of the transparent support substrate see a lower strain upon bending.

In one aspect the formation of a hardcoat layer that is not as strong (lower elastic modulus) and not as tough (lower scratch resistance) as the transparent support substrate such as glass or sapphire is counterintuitive to traditional protective cover layers where the strongest and toughest materials are used for the outermost protective layer. The hardcoat layer in accordance with embodiments is still sufficiently strong and tough to provide sufficient scratch resistance and durability (e.g. after months of daily scratches) while also preventing cracking of the more brittle transparent support substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a schematic isometric view illustration is provided of a protective cover layer 100 in accordance with an embodiment. As shown, the protective cover layer 100 may include a transparent support substrate 102 and a hardcoat layer 104 covering an exterior facing surface 103 of the transparent support substrate 102 when installed in an electronic device. In an embodiment, the transparent support substrate 102 is a glass substrate which may be formed of materials such as soda lime, borosilicate, fused silica, aluminosilicate, or any other thin glass material. The transparent support substrate 102 may also be formed of sapphire. The transparent support substrate may be a brittle material. The transparent support substrate may have a thickness less than 150 μm, such as 25 μm-125 μm.

The hardcoat layer 104 may be a hard material that has a lower elastic modulus and higher elongation-to-break than the transparent support substrate 102. The hardcoat layer 104 may optionally be characterized by a hardness that is less than that of the transparent support substrate 102. For example, the transparent support substrate 102 may have a pencil hardness greater than 9H, while the hardcoat layer 104 has a pencil hardness greater than 1H. In an embodiment, the hardcoat layer 104 has an elastic modulus range of 40 GPa-400 GPa. Typical elastic modulus of glass is around 60-75 GPa, and can go as low as 45 GPa with a high concentration of alkali cations. Sapphire can have an elastic modulus as high as 370 GPa. The hardcoat layer may have a thickness range of 1-200 μm, for example.

Figure 2:
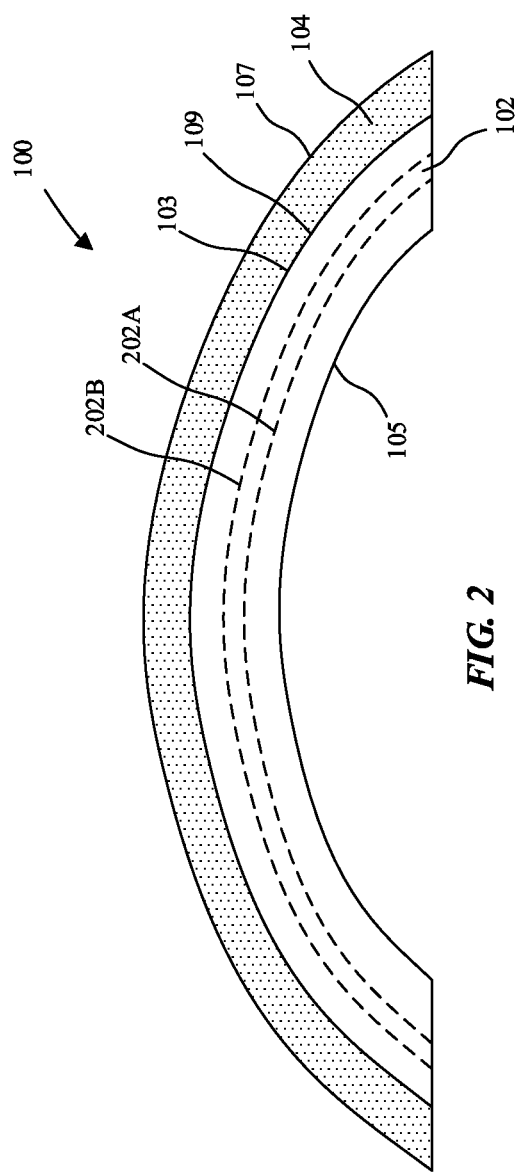
FIG. 2 is a schematic cross-sectional side view illustration of a bent protective cover layer in accordance with an embodiment.

Generally, the hardcoat layer 104 may be more resilient than the transparent support substrate 102. Referring to FIG. 2, a schematic cross-sectional side view illustration is provided of a bent protective cover layer 100 in accordance with an embodiment. Additionally illustrated are the neutral plane 202A for strain without the hardcoat layer 104, and the neutral plane 202B for strain with the addition of the hardcoat layer 104. As shown, addition of the hardcoat layer 104 can have the effect of shifting the neutral plane. This has the additional effect adjusting the high strain location. In the original configuration without the hardcoat layer 104, the exterior facing surface 103 of the transparent support substrate 102 sees the highest tensile strain, while the interior facing surface 105 of the transparent support substrate 102 sees the highest compressive strain. Addition of the hardcoat layer 104 can have the effect of shifting the neutral plane 202B, and lowering the tensile strain at the exterior facing surface 103 of the transparent support substrate 102 in the particular embodiment illustrated. Typically, glass fracture initiates from the presence of micro-cracks. The hardcoat layer 104 in accordance with embodiments may fill pre-existing micro-cracks and also make it harder to initiate a crack. Furthermore, the hardcoat layer 104 may be engineered to have a sufficiently high hardness and tensile strength to function as an exterior protective coating for the electronic device, while being able to withstand more strain before fracture compared to the transparent support substrate 102. Thus, the hardcoat layer 104 is sufficiently durable for high puncture and scratch resistance.

The hardcoat layer 104 may be a polymer-based material, and may be filled. In an embodiment the hardcoat layer 104 has a silica acrylate polymer matrix. Other polymer materials such as epoxy may be used. The polymer matrix is optionally filled with ceramic particles such as $Al_2O_3$, $MgAlO_4$, SiAlON, AlON, $ZrO_2$. Particle fillers may be sized and dispersed in a way to improve film strength, while not impacting optical properties of the film. The hardcoat layer 104 may have a refractive index matched with the transparent support substrate 102 or higher to aid in outcoupling of light. In an embodiment the hardcoat layer 104 is engineered to have a graded elastic modulus. For example, a high inorganic fraction can be included in the composition nearer the transparent support substrate 102 resulting in a glass-like modulus at the inner surface 109, with the inorganic fraction reducing toward to the outer (exterior facing) surface 107 resulting in a reduced elastic modulus. In an embodiment, the hardcoat layer is characterized by a graded elastic modulus that is lower nearest the transparent support substrate 102 and higher nearest an outer surface 107 of the hardcoat layer. The hardcoat layer may include a particle filler within a polymer matrix, and a particle filler concentration is higher nearest the transparent support substrate 102 and lower nearest the outer surface 107 of the hardcoat layer. The hardcoat layer may also comprise a multilayer structure of materials with different modulus properties.

The hardcoat layer 104 may be applied using physical vapor deposition (CVD) or solution-based techniques such as slot coating, spray coating, dip coating, and sol-gel. The hardcoat layer 104 may be applied to a polished surface, or surfaces, of the transparent support substrate. In an embodiment, the hardcoat layer is on a surface (e.g. 103, 105) of the transparent support substrate 102 characterized by an area roughness (Ra) of 0.5 nm-10 nm, and an outer (exterior facing) surface 107 of the hardcoat layer 104 is characterized by a greater area roughness than the surface of the transparent support substrate on which the hardcoat layer is located.

Figure 3:
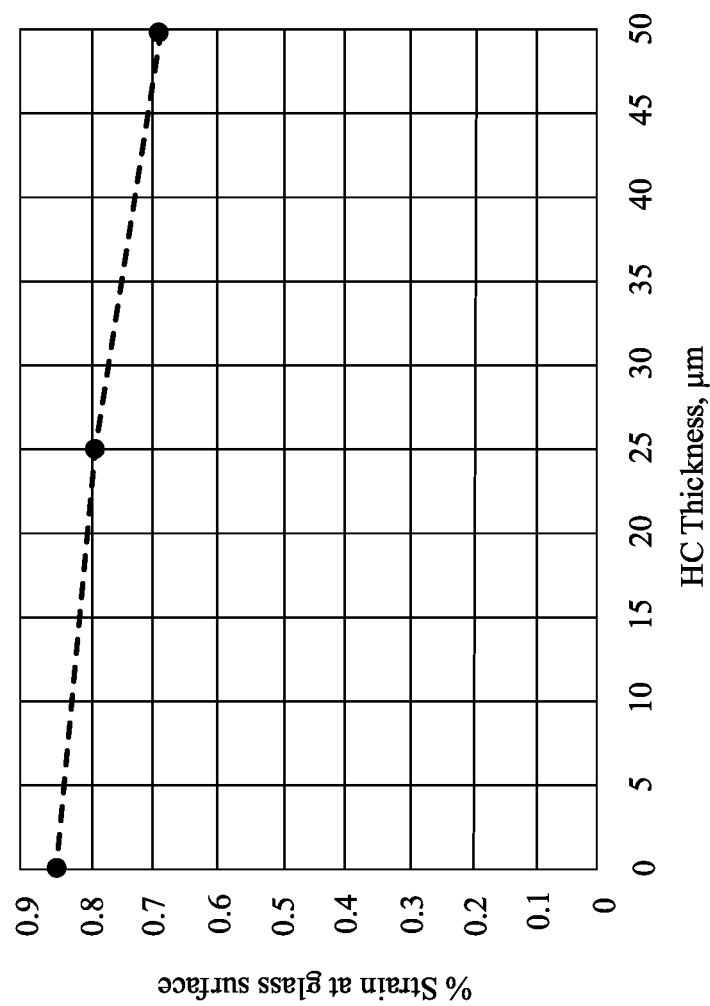
FIG. 3 is a plot of simulated tensile strain at the transparent support substrate surface for different hardcoat layer thicknesses in accordance with embodiments.

In order to demonstrate effectiveness of the hardcoat layer 104, both simulation and physical scratch/bending tests were performed. FIG. 3 is a plot of simulated tensile strain at the transparent support substrate exterior facing surface 103 for different hardcoat layer thicknesses in accordance with embodiments, with an outward bending direction as illustrated in FIG. 2. As shown, in the simulated bending tests, application of a 25 μm thick hardcoat layer 104 was simulated to reduce tensile strain at the exterior facing surface 103 of the transparent support substrate 102, with a 25 μm thick hardcoat layer 104 further reducing tensile strain.

Figure 4A:
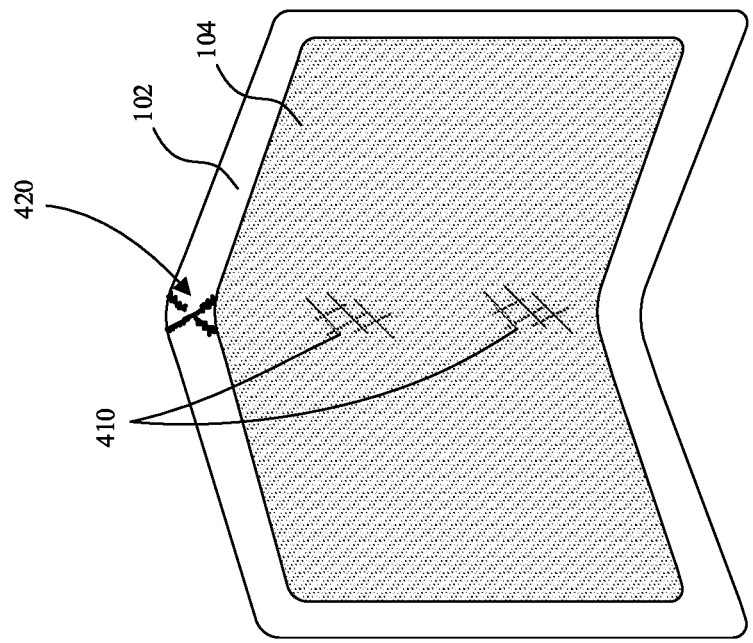
FIG. 4A is a schematic top view illustration of crack propagation in a scratched transparent support substrate in accordance with an embodiment.
Figure 4B:
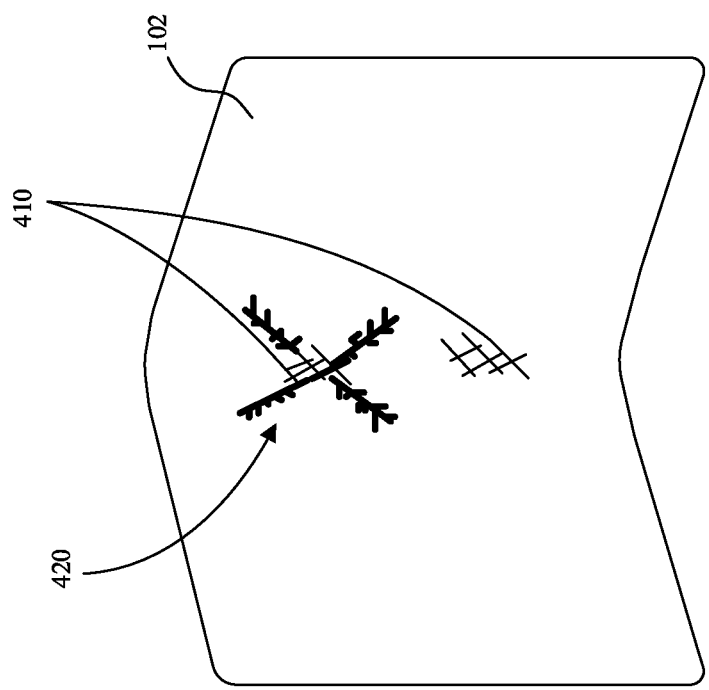
FIG. 4B is a schematic top view illustration of crack propagation in a scratched transparent support substrate with hardcoat layer in accordance with an embodiment.

Referring now to FIGS. 4A-4B scratch/bending tests were performed on a baseline transparent support substrate 102 (FIG. 4A) and a hardcoat layer 104 coated transparent support substrate 102 (FIG. 4A). As shown in the schematic top view illustrations of the tests, steel wool was used to create crack sites 410 at the same locations of the transparent support substrate 102. In each case, the transparent support substrate 102 was a 70 μm thick glass substrate. A 25 μm thick silica acrylate polymer hardcoat layer 104 was formed over a portion of the exterior facing surface 103 of the transparent support substrate 102 for the test sample of FIG. 4B, including over the crack sites 410.

Bending tests were performed until failure (crack propagation) of both test samples. The baseline sample of FIG. 4A resulted in a minimum radius of 3.05 mm at failure (crack propagation). As illustrated, the crack 420 formation and propagation initiated at a crack site 410. The test sample of FIG. 4B resulted in a minimum radius of 2.60 mm at failure. Crack 420 formation and propagation did not initiate at a crack site 410, and instead formed and propagated from a non-scratch site outside of the hardcoat layer 104 coating area. As demonstrated, the hardcoat layer 104 appears to have provided a higher level of durability, and protected the pre-existing crack sites 410 from propagating as well as the formation and propagation of new crack sites where the hardcoat layer 104 was formed.

Thus far embodiments have been described in which a single hardcoat layer 104 is applied to a single side of a transparent support substrate 102. Increased durability under outward bending has been verified with simulation and physical testing. However, embodiments are not so limited. Multiple hardcoat layers 104 may be applied to multiple sides of the transparent support substrate 102, or a single hardcoat layer 104 may be applied to multiple sides of the transparent support substrate 102 or cover all surfaces of the transparent support substrate 102. Furthermore, the hardcoat layer(s) 104 may be designed to increase durability for outward and/or inward bending. Additional layers may be applied between the hardcoat layer 104 and the transparent support substrate 102. Additionally, anti-smudge coating, such as an oleophobic coating may be applied to an external surface of the hardcoat layer 104. Preferably, the refractive index of the hardcoat is reasonably matched to the refractive index of the support substrate. In another embodiment, the hardcoat may serve as an antireflective layer for the display, comprising either a low refractive index material, or a multilayer structure providing antireflection properties.

Figure 5A:
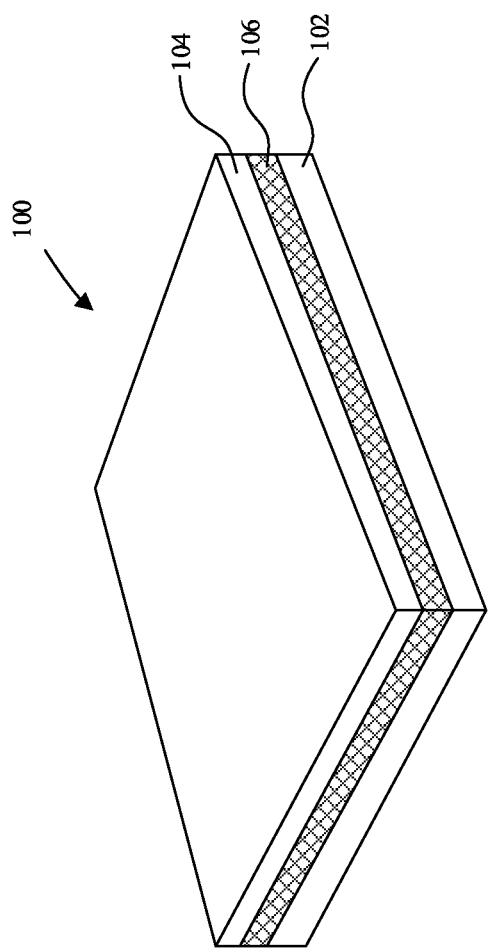
FIG. 5A is a schematic cross-sectional isometric view illustration of a protective cover layer including an intermediate glass fiber mesh layer in accordance with an embodiment.
Figure 5B:
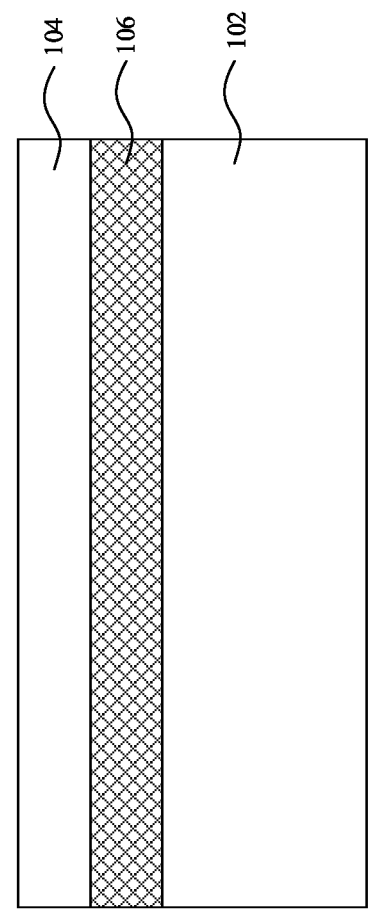
FIG. 5B is a schematic cross-sectional side view illustration of a protective cover layer including an intermediate glass fiber mesh layer in accordance with an embodiment.

FIG. 5A is a schematic cross-sectional isometric view illustration of a protective cover layer including an intermediate glass fiber mesh layer in accordance with an embodiment. FIG. 5B is a schematic cross-sectional side view illustration of a protective cover layer including an intermediate glass fiber mesh layer in accordance with an embodiment. As illustrated, a glass fiber mesh 106 may be located between the hardcoat layer 104 and the transparent support substrate 102. The glass fiber mesh 106 may function to catch fragments that break from the transparent support substrate 102, and reduce the potential for cracks to propagate from the transparent support substrate 102 into the hardcoat layer 104, and vice versa. Thus, the glass fiber mesh 106 may function to localize a fracture size. The refractive index of the glass fibers in the glass fiber mesh 106 may be matched with the refractive index of the hardcoat layer 104. For example the refractive indices may be within 1.45 to 1.75 based on a glass to sapphire range. In an embodiment, the hardcoat layer 104 impregnates the glass fiber mesh 106, for example, when applied using a solution-based technique.

Figure 6A:
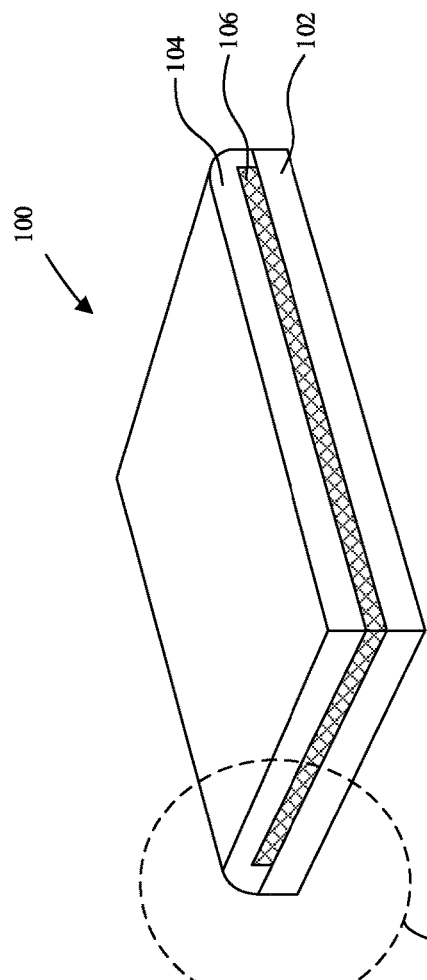
FIG. 6A is a schematic cross-sectional isometric view illustration of a protective cover layer including an intermediate glass fiber mesh layer in accordance with an embodiment.
Figure 6B:
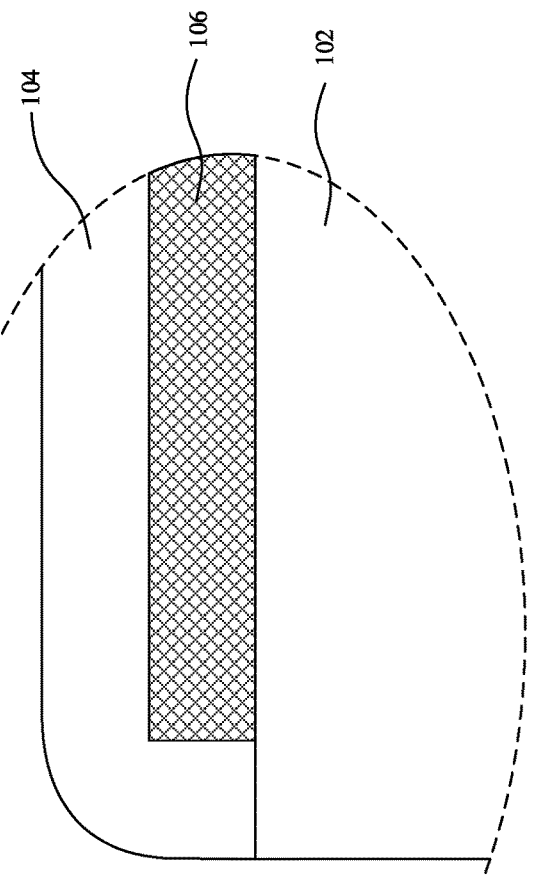
FIG. 6B is a close-up schematic cross-sectional side view illustration of the protective cover layer of FIG. 6A including an intermediate glass fiber mesh layer in accordance with an embodiment.

FIG. 6A is a schematic cross-sectional isometric view illustration of a protective cover layer including an intermediate glass fiber mesh layer in accordance with an embodiment. FIG. 6B is a close-up schematic cross-sectional side view illustration of the protective cover layer of FIG. 6A including an intermediate glass fiber mesh layer in accordance with an embodiment. In the embodiment illustrated the hardcoat layer 104 may surround lateral edges of the glass fiber mesh 106. Such a configuration may contain the potential for particle generation by the glass fiber mesh 106, and provide additional area for adhesion of the hardcoat layer 104 to the transparent support substrate 102. Preferably, the hardcoat layer is reasonably matched in refractive index to the glass mesh.

Figure 7:
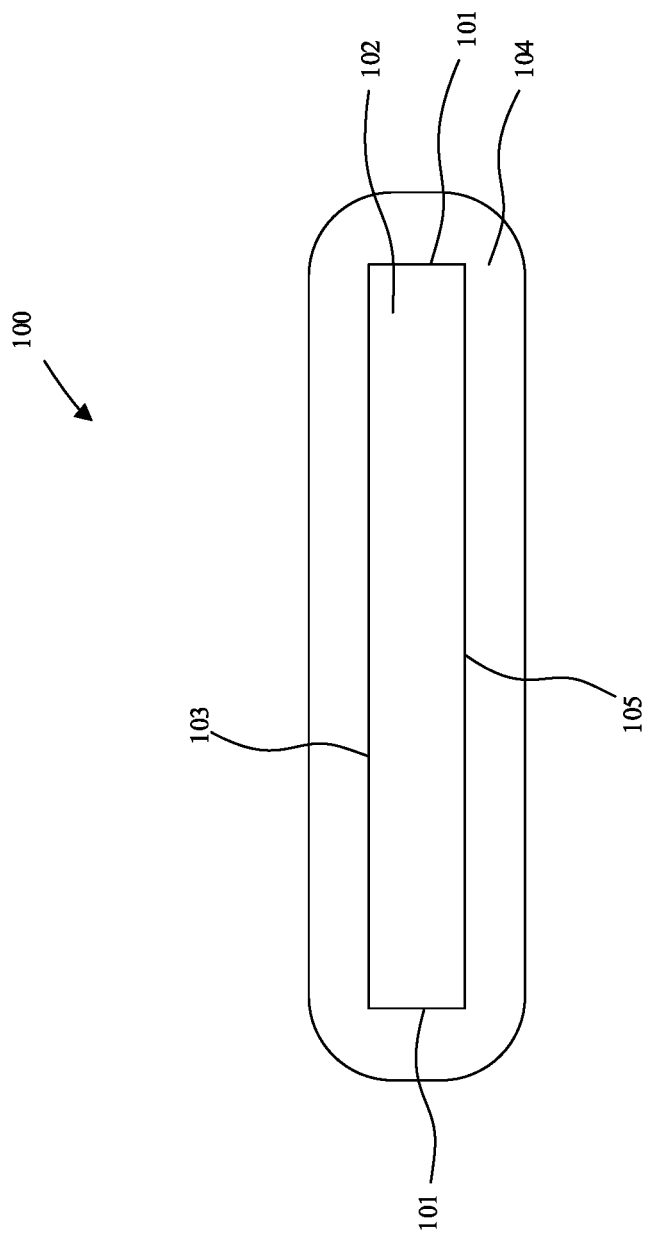
FIG. 7 is a schematic cross-sectional side view illustration of a protective cover layer including a hardcoat layer surrounding a transparent support substrate in accordance with an embodiment.
Figure 8:
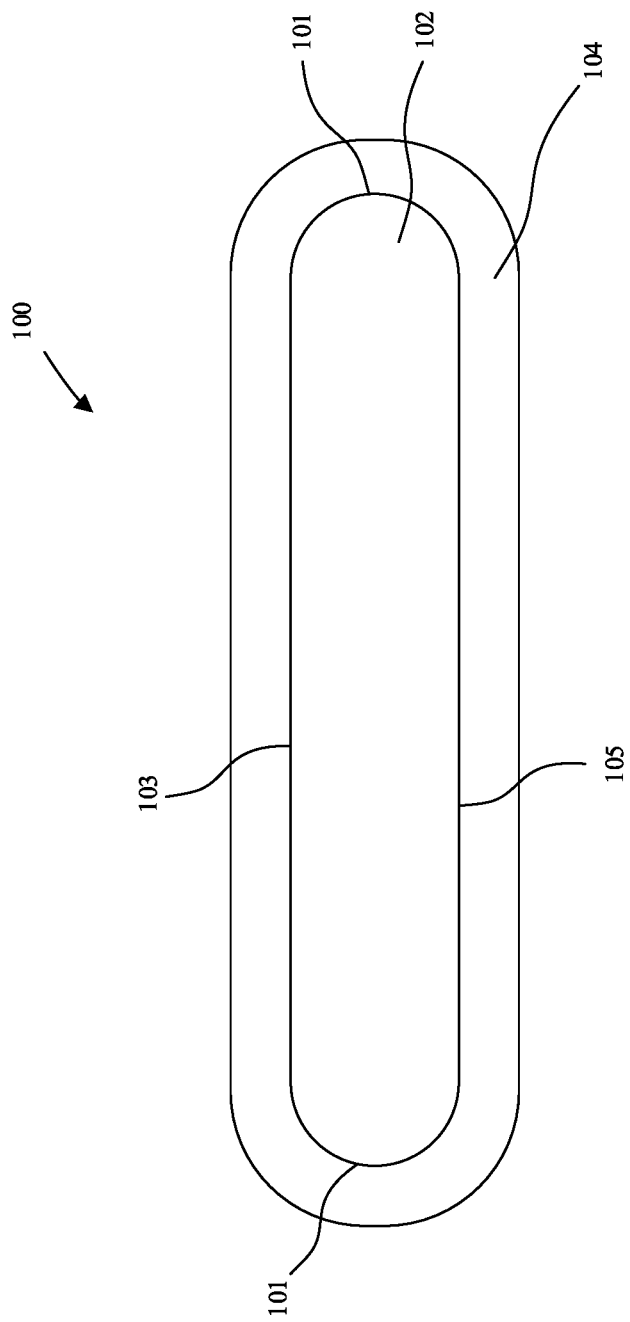
FIG. 8 is a schematic cross-sectional side view illustration of a protective cover layer including a hardcoat layer surrounding a transparent support substrate with tapered edges in accordance with an embodiment.

FIG. 7 is a schematic cross-sectional side view illustration of a protective cover layer 100 including a hardcoat layer 104 surrounding a transparent support substrate 102 in accordance with an embodiment. In an embodiment, the hardcoat layer 104 is formed on both the exterior facing surface 103 and an opposite interior facing surface 105 of the transparent support substrate 102. In an embodiment, the hardcoat layer 104 wraps around one or more lateral edges 101 of the transparent support substrate 102. Referring to FIG. 8, in an embodiment, the one or more lateral edges 101 of the transparent support substrate 102 may be tapered. Thickness of the hardcoat layer(s) 104 may be different on the exterior facing surface 103 and the interior facing surface 105 of the transparent support substrate 102 depending upon application. For example, for an outward bending application, the hardcoat layer 104 may be thicker on the exterior facing surface 103, while the hardcoat layer 104 may be thicker on the interior facing surface 105 for an inward bending application. In embodiment, the hardcoat layer 104 is only applied on the interior facing surface 105 (not the exterior facing surface 103) for an inward bending application.

Figure 9:
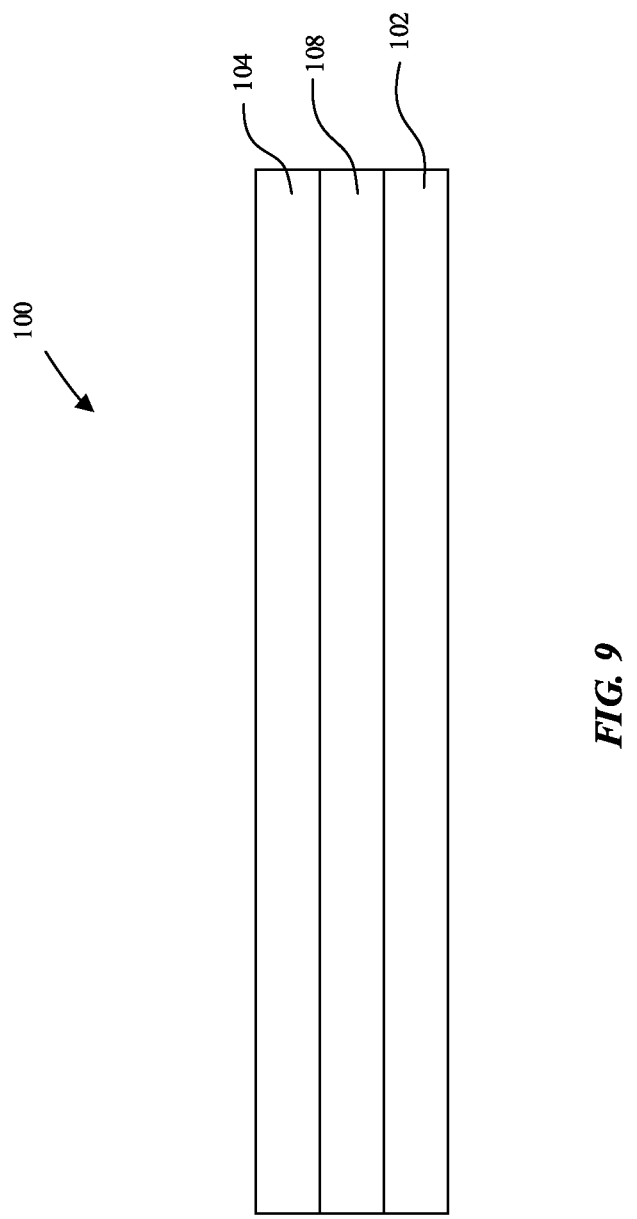
FIG. 9 is a schematic cross-sectional view illustration of a protective cover layer including an intermediate polymer adhesion layer in accordance with an embodiment.
Figure 10:
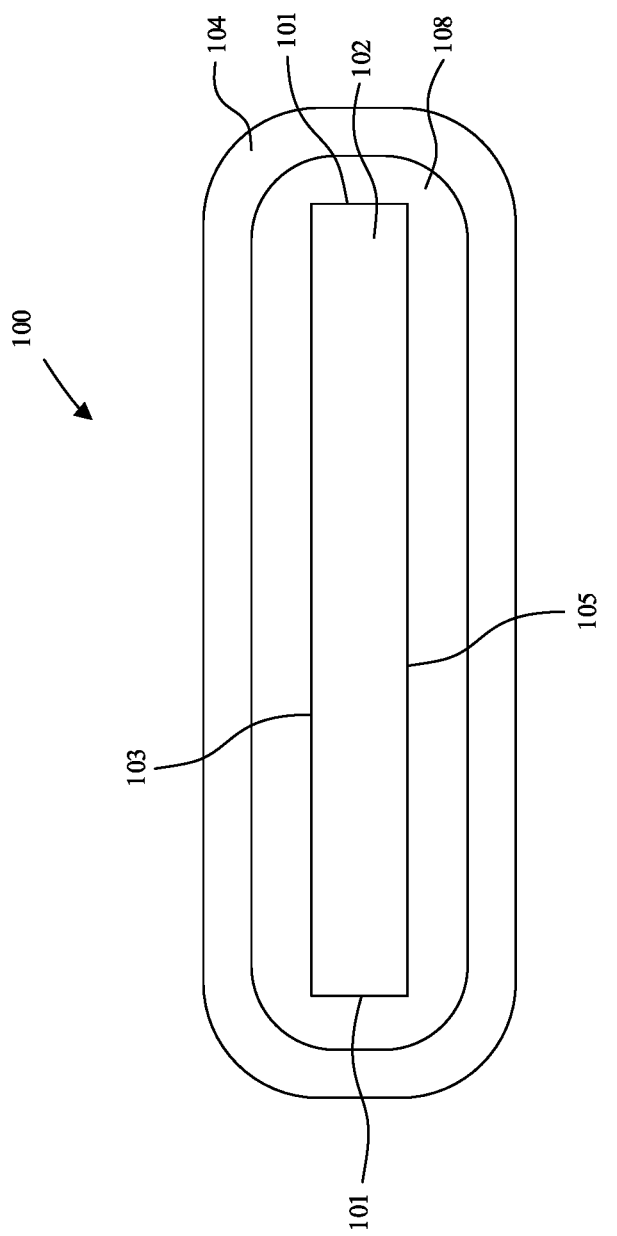
FIG. 10 is a schematic cross-sectional side view illustration of a protective cover layer including an intermediate polymer adhesion layer and hardcoat layer surrounding a transparent support substrate in accordance with an embodiment.
Figure 11:
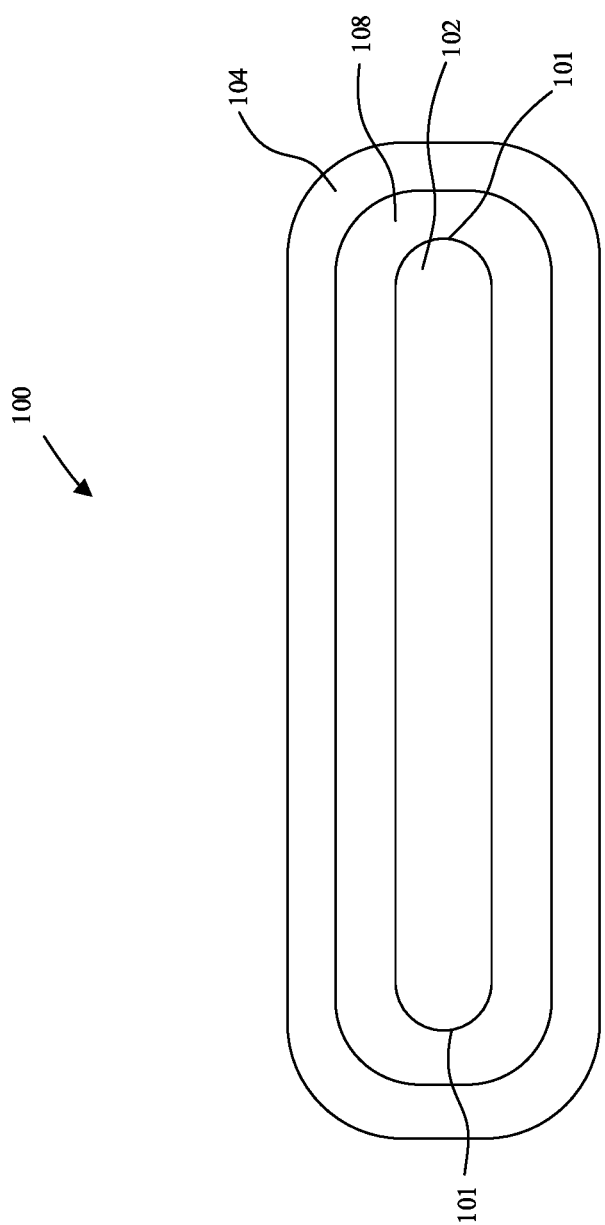
FIG. 11 is a schematic cross-sectional side view illustration of a protective cover layer including an intermediate polymer layer and hardcoat layer surrounding a transparent support substrate with tapered edges in accordance with an embodiment.

FIG. 9 is a schematic cross-sectional view illustration of a protective cover layer 100 including an intermediate polymer adhesion layer 108 in accordance with an embodiment. In an embodiment, the polymer adhesion layer 108 is located between the hardcoat layer 104 and the transparent support substrate 102. The polymer adhesion layer may be 1-5 μm thick, for example. The polymer adhesion layer 108 may be optically transparent and may function to promote adhesion of the hardcoat layer 104, which may have greater adhesion to the polymer adhesion layer 108 than to the material forming the transparent support substrate 102. In the embodiment illustrated in FIG. 10, the polymer adhesion layer 108 may surround the transparent support substrate 102. The hardcoat layer 104 may also surround the polymer adhesion layer 108. Referring to FIG. 11, in an embodiment, the one or more lateral edges 101 of the transparent support substrate 102 may be tapered.

Referring now to FIGS. 12A-12B schematic isometric view illustrations of an electronic device 1200 are provided in accordance with embodiments. FIG. 13 is a schematic cross-sectional side view illustration of an electronic device 1200 in accordance with an embodiment. In particular, the electronic device 1200 includes a display panel 150 and protective cover layer 100 over the display panel 150. The protective cover layer 100 may be any of the protective cover layers 100 described herein. The display panel 150 and protective cover layer 100 may be curved, flexible, conformable and/or foldable. FIG. 12A illustrates an outward bending application, while FIG. 12B illustrates an inward bending application. In an embodiment, the display panel 150 and protective cover layer 100 are capable of both outward and inward bending. In an embodiment, the protective cover layer 100 flexes with the flexible display panel 150 and includes a transparent support substrate 102 and a hardcoat layer 104 covering an exterior facing surface 103 of the transparent support substrate 102. In an embodiment, the flexible display panel is foldable, and the protective cover layer folds with the foldable display panel.

Referring to FIG. 13, in an embodiment, the hardcoat layer 104 of the protective cover layer 100 may define an exterior surface of the electronic device 1200. For example, the outer (exterior facing) surface 107 may define the exterior surface of the electronic device 1200. In an embodiment and anti-smudge coating, such as an oleophobic coating may be applied to an external surface of the hardcoat layer 104. In an embodiment, a touch screen is located between the display panel 150 and the protective cover layer 100. A space 1250 may be included in the electronic device 1200 housing 1210 to group various components such as a processer, memory, battery, wireless transceiver/receiver etc. for operation of the electronic device. As shown in FIGS. 12A-12B, housing 1210 may additionally include openings for controls 1220, port 1230, etc.

In utilizing the various aspects of the embodiments, it would become apparent to one skilled in the art that combinations or variations of the above embodiments are possible for forming a curved, flexible, and/or conformable display with protective cover layer. Embodiments may be implemented in a variety of electronic devices including non-portable and portable devices, including wearable devices. Exemplary electronic devices include a communication device (e.g., mobile phone, smart phone, smart watch, wearable device), a multi-media device (e.g., MP3 player, TV, radio), a portable or handheld computer (e.g., tablet, netbook, laptop), a desktop computer, an All-In-One desktop, a peripheral device, a television, or any other system or device adaptable to the inclusion of a protective cover layer in accordance with embodiments. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic device comprising:
    a display panel;
    a protective cover layer over the display panel, wherein the protective cover layer includes a transparent support substrate and a hardcoat layer covering an exterior facing surface of the transparent support substrate;
    wherein the hardcoat layer has a thickness range of 1-200 μm and the transparent support substrate has a thickness less than 150 μm; and
    wherein the hardcoat layer is on a surface of the transparent support substrate characterized by an area roughness (Ra) of 0.5 nm-10 nm, and an exterior facing surface of the hardcoat layer is characterized by a greater area roughness than the surface of the transparent support substrate on which the hardcoat layer is located.

2. The electronic device of claim 1, wherein the hardcoat layer defines an exterior surface of the electronic device.

3. The electronic device of claim 1, further comprising a touch screen between the display panel and the protective cover.

4. The electronic device of claim 1, wherein the hardcoat layer is characterized by a lower elastic modulus than the transparent support substrate.

5. The electronic device of claim 1, wherein the display panel is flexible, and further comprising a housing to contain the flexible display panel and the protective cover layer.

6. The electronic device of claim 1, wherein the transparent support substrate is formed of a material selected from the group consisting of glass and sapphire.

7. An electronic device comprising:
    a display panel; and
    a protective cover layer over the display panel, wherein the protective cover layer includes a transparent support substrate and a hardcoat layer covering an exterior facing surface of the transparent support substrate;
    wherein one or more lateral edges of the transparent support substrate are tapered.

8. The electronic device of claim 7, further comprising a polymer adhesion layer between the hardcoat layer and the transparent support substrate.

9. The electronic device of claim 8, wherein the polymer adhesion layer is 1-10 μm thick.

10. The electronic device of claim 7, wherein the transparent support substrate is formed of a material selected from the group consisting of glass and sapphire.

11. The electronic device of claim 7, further comprising a smudge resistant coating on an exterior facing coating of the hardcoat layer.

12. An electronic device comprising:
    a display panel; and
    a protective cover layer over the display panel, wherein the protective cover layer includes a transparent support substrate and a hardcoat layer covering an exterior facing surface of the transparent support substrate;
    wherein the hardcoat layer is characterized by a hardness that is less than that of the transparent support substrate.

13. The electronic device of claim 12, wherein the transparent support substrate has a pencil hardness greater than 9H, and the hardcoat layer has a pencil hardness greater than 1H.

14. The electronic device of claim 12, wherein the hardcoat layer has an elastic modulus range of 40 GPa-400 GPa.

15. The electronic device of claim 12, wherein the hardcoat layer comprises a multilayer structure of materials with different elastic modulus properties.

16. The electronic device of claim 15, wherein the hardcoat layer provides antireflection properties.

17. The electronic device of claim 12, further comprising an intermediate layer between the hardcoat layer and the transparent support substrate.

18. An electronic device comprising:
    a display panel; and a protective cover layer over the display panel, wherein the protective cover layer includes:
a transparent support substrate;
a hardcoat layer covering an exterior facing surface of the transparent support substrate; and
an intermediate polymer adhesion layer between the hardcoat layer and the transparent support substrate.

19. The electronic device of claim 17, wherein the hardcoat layer has greater adhesion to the intermediate polymer adhesion layer than to a material forming the transparent support substrate.

20. The electronic device of claim 17, wherein the display panel is flexible, and further comprising a housing to contain the flexible display panel and the protective cover layer.

\* \* \* \* \*